(12) United States Patent
Kim et al.

(10) Patent No.: US 7,894,231 B2
(45) Date of Patent: Feb. 22, 2011

(54) MEMORY MODULE AND DATA INPUT/OUTPUT SYSTEM

(75) Inventors: Kyung Hoon Kim, Gyeonggi-do (KR); Sang Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 64 days.

(21) Appl. No.: 12/483,328

(22) Filed: Jun. 12, 2009

(65) Prior Publication Data

US 2010/0142244 A1 Jun. 10, 2010

(30) Foreign Application Priority Data

Dec. 8, 2008 (KR) ...................... 10-2008-0124267

(51) Int. Cl.
*G11C 5/02* (2006.01)
(52) U.S. Cl. ............... 365/51; 365/189.02; 365/189.04; 365/189.05
(58) Field of Classification Search ............. 365/189.03
See application file for complete search history.

(56) References Cited

U.S. PATENT DOCUMENTS 5,666,322 A * 9/1997 Conkle ................. 365/230.03

7,078,793 B2 7/2006 Ruckerbauer et al.
7,471,538 B2 * 12/2008 Hofstra ........................ 365/51
7,650,457 B2 * 1/2010 Ruckerbauer .................. 711/5

FOREIGN PATENT DOCUMENTS

| JP | 10-302470 A | 11/1998 |
|---|---|---|
| KR | 10-0071110 B1 | 8/1993 |
| KR | 10-0842403 B1 | 6/2008 |

* cited by examiner

*Primary Examiner*—Tan T. Nguyen
(74) *Attorney, Agent, or Firm*—Ladas & Parry LLP

(57) ABSTRACT

A memory module is configured to include a first rank installed with a first memory chip and a second rank installed with a second memory chip. When the first and second memory chips are in a first data output mode, the first memory chip is configured to externally output lower order data of a plurality of data via lower data output pins. Also, when the first and second memory chips are in the first data output mode, the second memory chip is configured to externally output data that has the same order as the lower order data output by the first memory chip via upper data output pins.

19 Claims, 5 Drawing Sheets

MEMORY MODULE AND DATA INPUT/OUTPUT SYSTEM

CROSS-REFERENCES TO RELATED PATENT APPLICATION

The present application claims priority under 35 U.S.C 119(a) to Korean Application No. 10-2008-0124267, filed on Dec. 8, 2008, in the Korean Intellectual Property Office, which is incorporated herein by reference in its entirety as set forth in full.

BACKGROUND

The present invention relates generally to a data input/output system, and more particularly, to a memory module and a data input/output system.

Typically, a system such as a personal computer (PC), a portable multimedia device, or a mobile phone is configured to include a data input/output system in order to store data required for operation and to read stored data.

A data input/output system will typically include various types of chip sets. Examples of these chip sets include memory for data storage (for example, dynamic random access memory (DRAM)) and a memory controller for controlling the memory (for example, a central processing unit (CPU), a graphic processing unit (GPU), a memory control unit (MCU), and the like).

Figure 1:
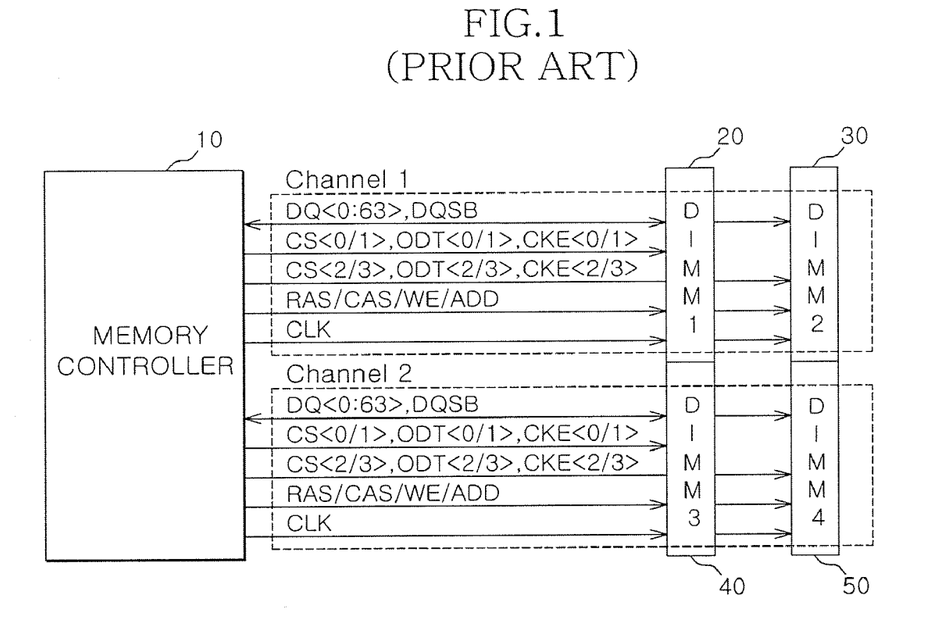
FIG. 1 is a block diagram illustrating a data input/output system.

FIG. 1 is a block diagram illustrating a conventional data input/output system.

As shown in FIG. 1, the conventional data input/output system is configured to include a memory controller 10, a first memory module 20, a second memory module 30, a third memory module 40, and a fourth memory module 50.

Each of the first through the fourth memory modules 20, 30, 40, and 50 shown in FIG. 1 is configured as a dual in-line memory module (DIMM).

Additionally, each of the first through the fourth memory modules 20, 30, 40, and 50 is configured to include two ranks (a memory rank, for example, is a block or area of data that is created using some or all of the memory chips on a memory module). More specifically, a plurality of memory chips may be installed on one or both surfaces of each of the first through the fourth memory modules 20, 30, 40, and 50 in order to obtain a single rank or two ranks. When the plurality of memory chips is installed on both surfaces of each of the first through fourth memory modules 20, 30, 40, and 50, each of the first through the fourth memory modules 20, 30, 40, and 50 may be configured to include two ranks. When the plurality of memory chips is installed on a single surface of each of the first through fourth memory module 20, 30, 40, and 50, each of the first through the fourth memory modules 20, 30, 40, and 50 is configured to include a single rank.

The memory controller 10 commonly connects certain signal lines to the first and second memory modules 20, 30 and the third and fourth memory modules 40, 50 via channel 1 and channel 2, respectively. These signal lines are used to transmit data (DQ<0:63>), a data strobe signal DQSB, an operation command and an address (RAS, CAS, WE, ADD), and a clock signal CLK. Also, the memory controller 10 connects signal lines to the first through the fourth memory modules 20, 30, 40, and 50. The signal lines are also used to transmit chip selection signals (CS0/1, CS2/3), on die termination signals (ODT0/1, ODT2/3), and clock enable signals (CKE0/1, CKE2/3) that are classified for each rank of the first through the fourth memory modules 20, 30, 40, and 50.

When the first memory module 20 is configured to include two ranks in channel 1, two chip selection signals (CS0/1, CS2/3), two on die termination signals (ODT0/1, ODT2/3), and two clock enable signals (CKE0/1, CKE2/3) are required to selectively control the two ranks of the first memory module 20.

Additionally, four chip selection signals (CS0/1, CS2/3), on die termination signals (ODT0/1, ODT2/3), and clock enable signals (CKE0/1, CKE2/3) are required to control both the first memory module 20 and the second memory module 30 each of which includes two ranks.

Accordingly, as illustrated, the technology shown in FIG. 1 requires an additional rank selection signal (that is, a chip selection signal), an additional on die termination signal, and an additional clock enable signal for the memory extension.

The requirement of an additional signal for the memory extension leads to an increase in both the number of signal lines and the number of pins. The additional signal can also make it more difficult to control a memory module.

SUMMARY

Embodiments of the present invention include a memory module and a data input/output system in which the number of control signals required to control a memory module is minimized.

In one aspect of the present invention a memory module includes: a first rank to be installed with a first memory chip; and a second rank to be installed with a second memory chip, wherein, in a first data output mode, the first memory chip is configured to externally output, via lower data output pins, predetermined lower order data among a plurality of data, and in the first data output mode, the second memory chip is configured to externally output, via upper data output pins, data having the same order as the lower order data among the plurality of data In another aspect of the present invention, a data input/output system includes: a first memory module configured to include a first rank to be installed with a first memory chip and a second rank to be installed with a second memory chip, wherein the first memory chip and the second memory chip are configured to output each of the data via non-overlapping data output pins among a plurality of data output pins that are commonly connected to the first memory chip and the second memory chip; and a memory controller configured to commonly supply a chip selection signal to the first memory chip and the second memory chip and to thereby simultaneously activate the first memory chip and the second memory chip.

In yet another aspect of the present invention, a data input/output system includes: a first memory module configured to include a first rank to be installed with a first memory chip and a second rank to be installed with a second memory chip; a second memory module configured to include a third rank to be installed with a third memory chip; and a memory controller to commonly supply a chip selection signal to the first memory chip and the third memory chip, wherein the first memory chip and the third memory chip are simultaneously activated according to the rank selection signal and are configured to output each of data via each corresponding data output pin.

In a memory module and a data input/output system according to embodiments of the present invention the number of control signals required to control the memory module is minimized. Accordingly, it is possible to decrease the number of pins at a memory controller and the memory module, and to simplify control logic to control the memory module.

These and other features, aspects, and embodiments are described below in the section "Detailed Description".

BRIEF DESCRIPTION OF THE DRAWINGS

Features, aspects, and embodiments are described in conjunction with the attached drawings, in which.

DETAILED DESCRIPTION

Hereinafter, exemplary embodiments will be described in detail with reference to the accompanying drawings.

Figure 2:
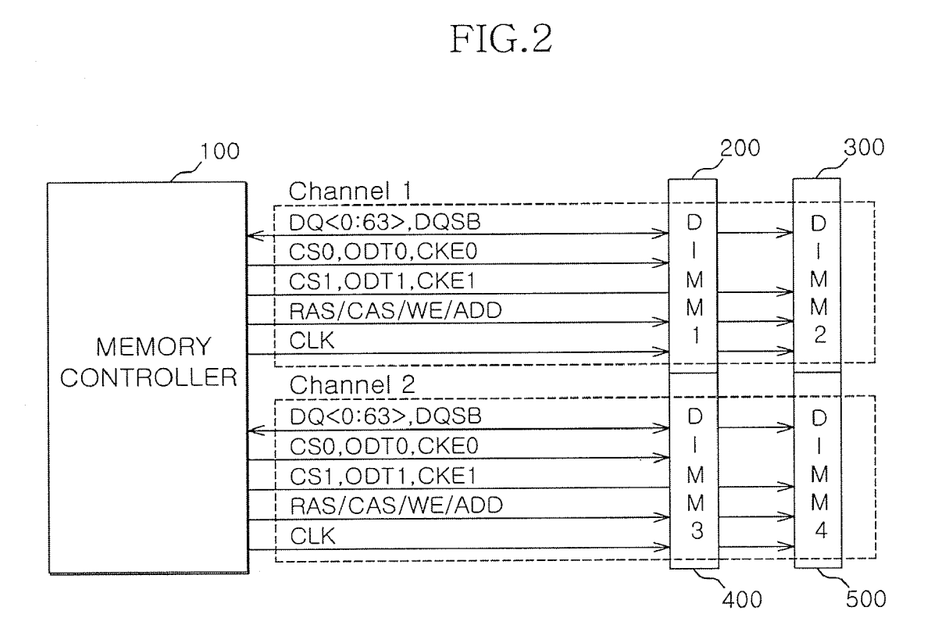
FIG. 2 is a block diagram showing a data input/output system according to an embodiment of the present invention.

FIG. 2 is a block diagram showing a data input/output system according to an embodiment of the present invention.

As shown in FIG. 2, the data input/output system according to an embodiment of the present invention includes a memory controller 100, a first memory module 200, a second memory module 300, a third memory module 400, and a fourth memory module 500.

Each of the first through the fourth memory modules 200, 300, 400, and 500 may be configured as a dual in-line memory module (DIMM).

The respective first through fourth memory modules 200, 300, 400, and 500 may be configured to include two ranks. More specifically, a plurality of memory chips may be installed on both surfaces or a single surface of each of the first through the fourth memory modules 200, 300, 400, and 500. When the plurality of memory chips is installed on both surfaces of a memory module of the first through fourth memory module 200, 300, 400, and 500, the memory module may be configured to include two ranks. When the plurality of memory chips is installed on a single surface of a memory module of the first through the fourth memory modules 200, 300, 400, and 500, the memory module may be configured to include a single rank.

In the embodiment of the present invention shown in FIG. 2, the first module 200 and the second module 300 are connected to the memory controller 100 via channel 1. The third module 400 and the fourth module 500 are connected to the memory controller 100 via channel 2.

Channels 1 and 2 may be separately controlled; however, even when separately controlled data input/output operations via the respective channels 1 and 2, may be performed using the same scheme. Also, the same signals may be used. Accordingly, descriptions will be made while referring to channel 1.

The memory controller 100 may commonly connect certain signal lines to the first memory module 200 and the second memory module 300. These signal lines may be used to transmit data (DQ<0:63>), a data strobe signal DQSB, an operation command and an address (RAS, CAS, WE, ADD), and a clock signal CLK.

In the embodiment of the present invention shown in FIG. 2, the first memory module 200 receives a common chip selection signal CS0, a common on die termination signal ODT0, and a common clock enable signal CKE0. Because these signals are common to the first memory module 200, they are not classified for each rank.

Additionally, the second memory module 300 also receives a common chip selection signal CS1, a common on die termination signal ODT1, and a common clock enable signal CKE1, rather than multiple signals for a single memory module.

In data input/output system of FIG. 1, the first memory module 20 and the second memory module 30 receive signals that are classified for each rank, that is, chip selection signals (CS0/1, CS2/3), on die termination signals (ODT0/1, ODT2/3), and clock enable signals (CKE0/1, CKE2/3). However, in the embodiment of the present invention shown in FIG. 1, the first memory module 200 and the second memory module 300 use the common chip selection signals (CS0, CS1), the common on die termination signals (ODT0, ODT1), and the common clock enable signals (CKE0, CKE1), respectively. Accordingly, the number of signals is decreased by half, and as a result, the number of signal lines and the number of pins is decreased by half.

Figure 3:
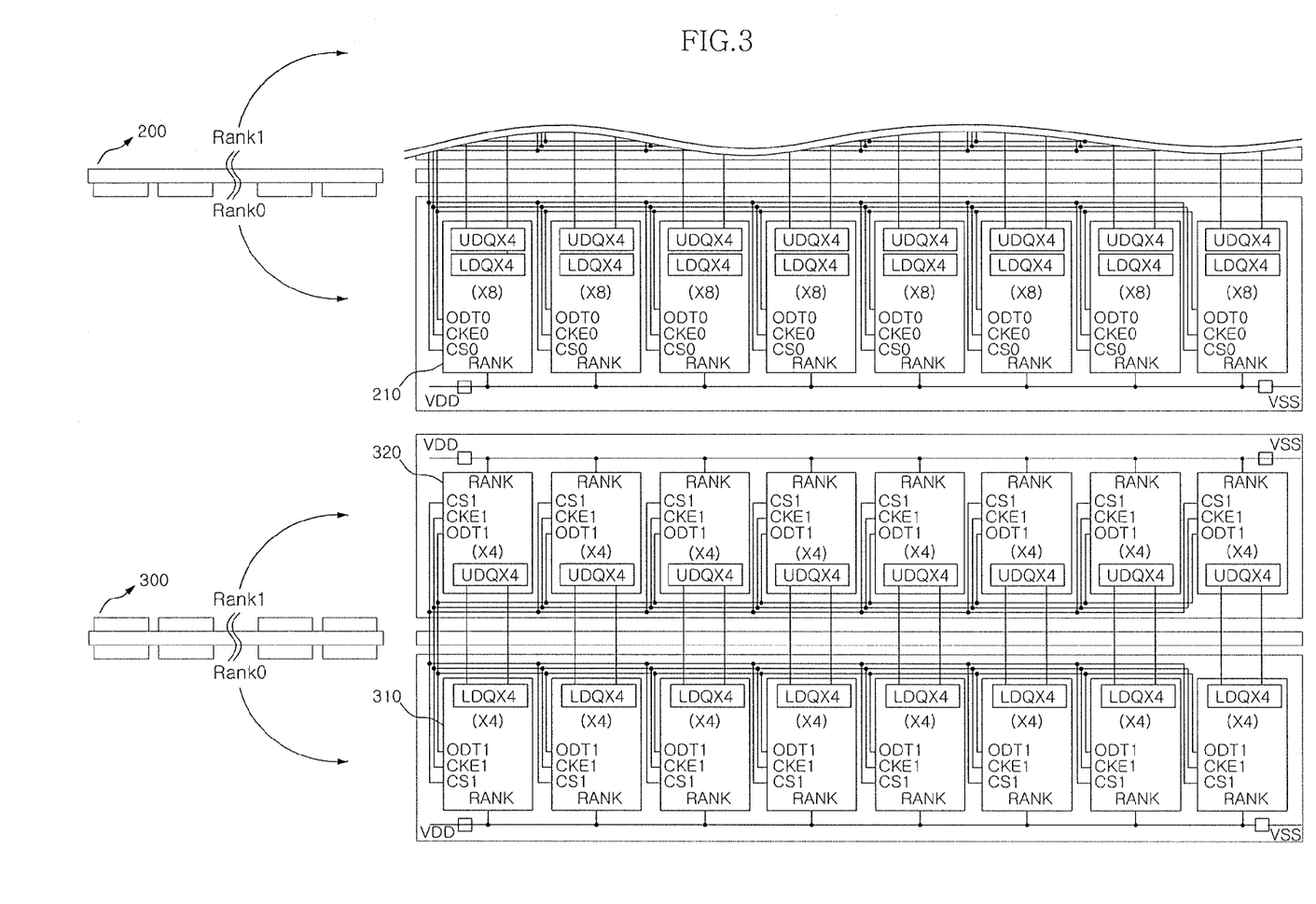
FIG. 3 is a layout diagram showing the memory module of FIG. 2.

FIG. 3 is a layout diagram showing the memory module of FIG. 2.

Referring to FIG. 3, the first memory module 200 is configured to include a single rank, that is, a first rank RANK0. The second memory module 300 is configured to include two ranks, that is, a first rank RANK0 and a second rank RANK1.

Additionally, FIG. 3 shows an embodiment in which a memory chip 210 installed in the first rank RANK0 of the first memory module 200 is set to a second data output mode X8, and a memory chip 310 installed in the first rank RANK0 of the second memory module 300 and a memory chip 320 installed in the second rank RANK1 thereof are set to a first data output mode X4.

In the embodiment of the present invention shown in FIG. 3, the memory chip 310 installed in the first rank RANK0 of the second memory module 300, and the memory chip 320 installed in the second rank RANK1 of the second memory module are configured to share the chip selection signal CS1, the on die termination signal ODT1, and the clock enable signal CKE1. Also, each of the memory chips 210, 310, and 320 may be configured to identify its corresponding rank RANK0 or RANK1 according to the level of a signal applied to a rank classification terminal RANK. More specifically, when a high level VDD is applied to the rank classification terminal RANK, the rank can be identified as the first rank RANK0. When a low level VSS is applied, the rank can be identifies as the second rank RANK1.

In an embodiment of the present invention, the data output logic connected to all of the DQ pins (DQ<0:7>) of the respective memory chips 210, 310, and 320 is classified into a lower data output logic LDQX4 connected to lower DQ pins (DQ<0:3>) and an upper data output logic UDQX4 connected to upper DQ pins (DQ<4:7>). The respective memory chips 210, 310, and 320 may be configured to activate both or any one of the lower data output logic LDQX4 and the upper data output logic UDQX4. Descriptions related thereto will be made in detail later.

Figure 4:
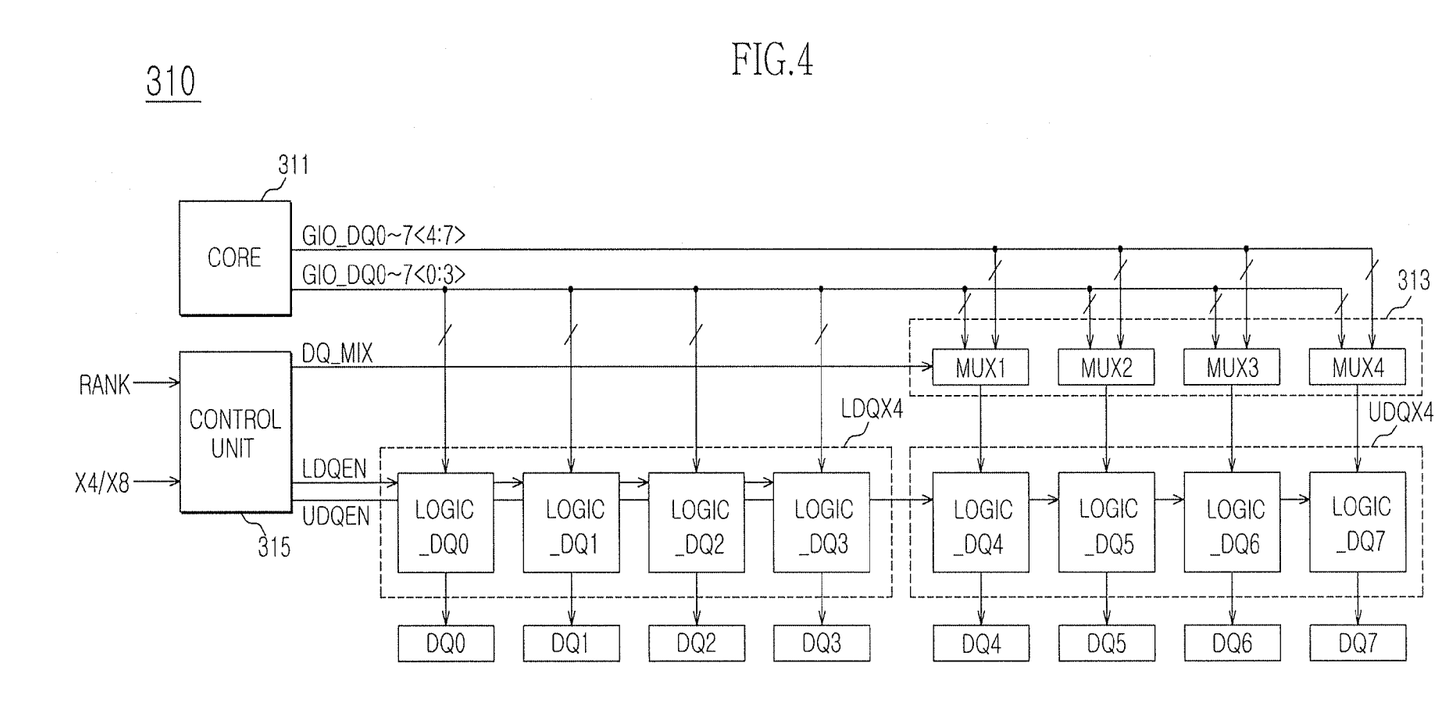
FIG. 4 is a block diagram showing the memory chip of FIG. 3.

FIG. 4 is a block diagram showing the memory chip of FIG. 3.

The memory chips 210, 310, and 320 may have the same configuration. As shown in FIG. 4, the memory chip 310 (the configuration shown in FIG. 4 can also be that of the memory chip 210 and the memory chip 220) may include a core 311, a lower data output logic LDQX4, a multiplexing unit 313, an upper data output logic UDQX4, a control unit 315, and DQ pins (DQ<0:7>).

In the embodiment of the present invention shown in FIG. 4, the core 311 is configured to output data (GIO_DQ0~7<0:7>).

The lower data output logic LDQX4 includes first through fourth data output logics (LOGIC_DQ0~LOGIC_DQ3). The lower data output logic LDQX4 is configured to output lower order data (GIO_DQ0~7<0:3>) via lower DQ pins (DQ<0:3>) according to a first activation control signal LDQEN.

In the embodiment of the present invention shown in FIG. 4, the multiplexing unit 313 includes first through fourth multiplexers MUX1, MUX2, MUX3, and MUX4. The multiplexing unit 313 is configured to select and output either the lower order data (GIO_DQ0~7<0:3>) or the upper order data (GIO_DQ0~7<4:7>) according to a multiplexing control signal DQ_MIX. More specifically, when the multiplexing control signal DQ_MIX is activated, the multiplexing unit 313 is configured to select and output the lower order data (GIO_DQ0~7<0:3>). Conversely, when the multiplexing control signal DQ_MIX is deactivated, the multiplexing unit 313 is configured to select and output the upper order data (GIO_DQ0~7<4:7>)

In the embodiment of the present invention shown in FIG. 4, the upper data output logic UDQX4 includes fifth through eighth data output logics (LOGIC_DQ4~LOGIC_DQ7). Also, the upper data output logic UDQX4 is configured to output the output of the multiplexing unit 313 via upper DQ pins (DQ<4:7>) in response to a second activation control signal UDQEN.

The control unit 315 is configured to generate the first activation control signal LDQEN, the second activation control signal UDQEN, and the multiplexing control signal DQ_MIX according to the signal level (i.e. VDD or VSS) of the rank classification terminal RANK, and an output mode signal (X4/X8) that designates whether the mode is the first data output mode X4 or the second data output mode X8.

Figure 5:
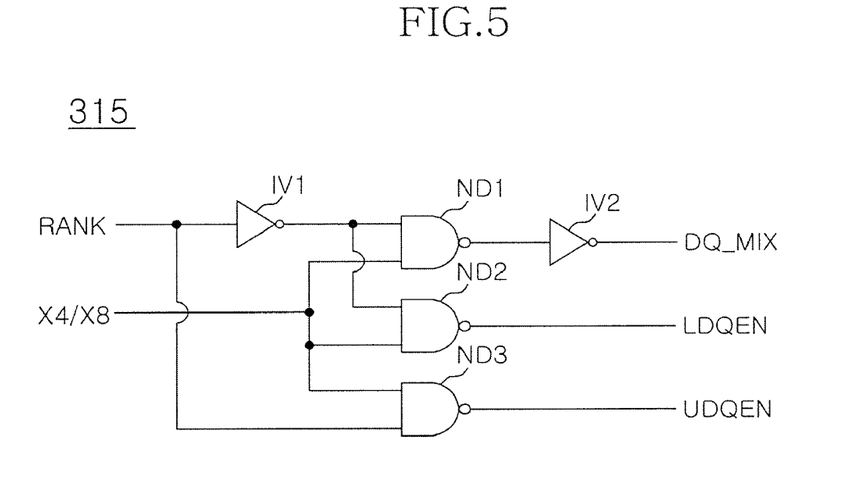
FIG. 5 is a circuit diagram showing the control unit of FIG. 4.

FIG. 5 is a circuit diagram showing the control unit 315 of FIG. 4.

TABLE 1

| RANK | X4/X8 | DQ_MIX | LDQEN | UDQEN |
|---|---|---|---|---|
| RANK 0 | X4 | DISABLE | ENABLE | DISABLE |
| RANK 1 | X4 | ENABLE | DISABLE | ENABLE |
| RANK 0 | X8 | DISABLE | ENABLE | ENABLE |
| RANK 1 | X8 | DISABLE | ENABLE | ENABLE |

In the embodiment of the present invention shown in FIG. 5, the control unit 315 includes a first inverter IV1 and a second inverter IV2, and first through third NAND gates ND1, ND2, and ND3. In FIG. 5, the control unit 315 is, for example, configured to satisfy the logic table shown in the above Table 1. In an embodiment of the present invention, when the output mode signal (X4/X8) is a high level, the mode is set to the first data output mode X4; and when the output mode signal (X4/X8) is at a low level, the mode is set to the second data output mode X8. Further, when a high level (e.g., VDD) is applied to the rank classification terminal RANK, the first rank RANK0 is identified; and when a low level (e.g., VSS) is applied to the rank classification terminal RANK, the second rank RANK1 is identified. Here, it is assumed in the above Table 1 that when a respective one of the multiplexing control signal DQ_MIX, first activation control signal LDQEN, and second activation control signal UDQEN is indicated as ENABLE, the signal is at a high level and when indicated as DISABLE, the signal is at a low level.

In the specific case of the memory chip 210 of the embodiment of the present invention shown in FIG. 3, when the memory chip 210 is set to the second data output mode X8; both the first activation control signal LDQEN and the second activation control signal UDQEN are activated as illustrated in Table 1, whereby all of the lower data output logic LDQX4 and the upper data output logic UDQX4 are activated.

In the specific case of the memory chip 310 of the embodiment of the present invention shown in FIG. 3, the memory chip 310 is set to the first data output mode X4, and the first rank RANK0 is identified since the high level is applied to the rank classification terminal RANK. Accordingly, only the first activation control signal LDQEN is activated, whereby only the lower data output logic LDQX4 may be activated.

In the specific case of the memory chip 320 of the embodiment of the present invention shown in FIG. 3. The memory chip 320 is set to the first data output mode X4 as is shown in FIG. 3, and the second rank RANK1 is identified since the low level is applied to the rank classification terminal RANK. Accordingly, only the second activation control signal UDQEN is activated, whereby only the upper data output logic UDQX4 may be activated.

Hereinafter, the operation of an embodiment of the present invention will be described.

As shown in FIG. 2, the chip selection signal CS0 output from the memory controller 100 is applied to the memory chip 210 installed in the first rank RANK0 of the first memory module 200 of FIG. 3.

The memory chip 210 is identified as being in the first rank RANK0 and is set to the second data output mode X8.

When the chip selection signal CS0 is activated, the memory chip 210 is activated.

As shown in FIG. 3, the memory chip 210 is set to the second data output mode X8, and therefore the lower data output logic LDQX4 and the upper data output logic UDQX4 are simultaneously activated regardless of the signal level of the rank classification terminal RANK as is shown in the logic table of Table 1 above. Referring to FIG. 4, the multiplexing unit 313 selects and outputs the upper order data (GIO_DQ0~7<4:7>) in response to the disabled multiplexing control signal.

Accordingly, the memory chip 210 can output the lower order data (GIO_DQ0~7<0:3>) to the lower DQ pins (DQ<0:3>) via the lower data output logic LDQX4, and can also output the upper order data (GIO_DQ0~7<4:7>) to the upper DQ pins (DQ<4:7>) via the upper data output logic UDQX4.

The chip selection signal CS1 output from the memory controller 100 is commonly applied to both the memory chip 310 installed in the first rank RANK0 of the second memory module 300 of FIG. 3 and the second memory chip 320 installed in the second rank RANK1 of the second memory module 300.

The memory chips 310 and 320 are identified as being in the first rank RANK0 and the second rank RANK1, respectively, and are both set to the first data output mode X4.

When the chip selection signal CS1 is activated, the memory chip 310 installed in the first rank RANK0 and the memory chip 320 installed in the second rank RANK1 are simultaneously activated.

Referring to the memory chip 310 installed in the first rank RANK0, the lower data output logic LDQX4 is activated and the upper data output logic UDQX4 is deactivated according to the logic table of the above Table 1.

The memory chip 310, which is installed in the first rank RANK0, outputs the lower order data (GIO_DQ0~7<0:3>) to the lower DQ pins (DQ<0:3>) via the lower data output logic LDQX4.

Referring to the memory chip 320, the upper data output logic UDQX4 is activated and the lower data output logic LDQX4 is deactivated according to the logic table of the above Table 1. The multiplexing unit 313 selects and outputs the lower order data (GIO_DQ0~7<0:3>) in response to the enabled multiplexing control signal DQ_MIX.

Accordingly, the memory chip 320 outputs the lower order data (GIO_DQ0~7<0:3>) to the upper DQ pins (DQ<4:7>) via the upper data output logic UDQX4.

Therefore, a total of 64 data (DQ<0:63>), that is, four data from each of the memory chips installed in the first rank RANK0 of the second memory module 300 and four data from each of the memory chips 320 installed in the second rank RANK1 of the second memory module 300 are output according to a single read command that is output from the memory controller 100.

In conventional data input/output systems, one problem that occurs when memory chips are installed in different ranks, is that the memory chips installed in these different ranks output data via overlapping DQ pins when they are selected; and therefore, in the conventional input/output systems the first rank RANK0 and the second rank RANK1 cannot be selected simultaneously. Instead, in the conventional input/output systems the first rank RANK0 and the second rank RANK1 have to be controlled using a separate control signal at certain time intervals.

However, in embodiments of the present invention, it is possible to simultaneously select the first rank RANK0 and the second rank RANK1, since the data input/output system is configured such that the memory chips installed in the respective first and second ranks RANK0 and RANK1 can output data via DQ pins that do not overlap (e.g., data is output via the lower DQ pins of memory chips in RANK0 and upper DZ pins of memory chips in RANK1). Accordingly, it is possible to prevent the data from overlapping.

Figure 6:
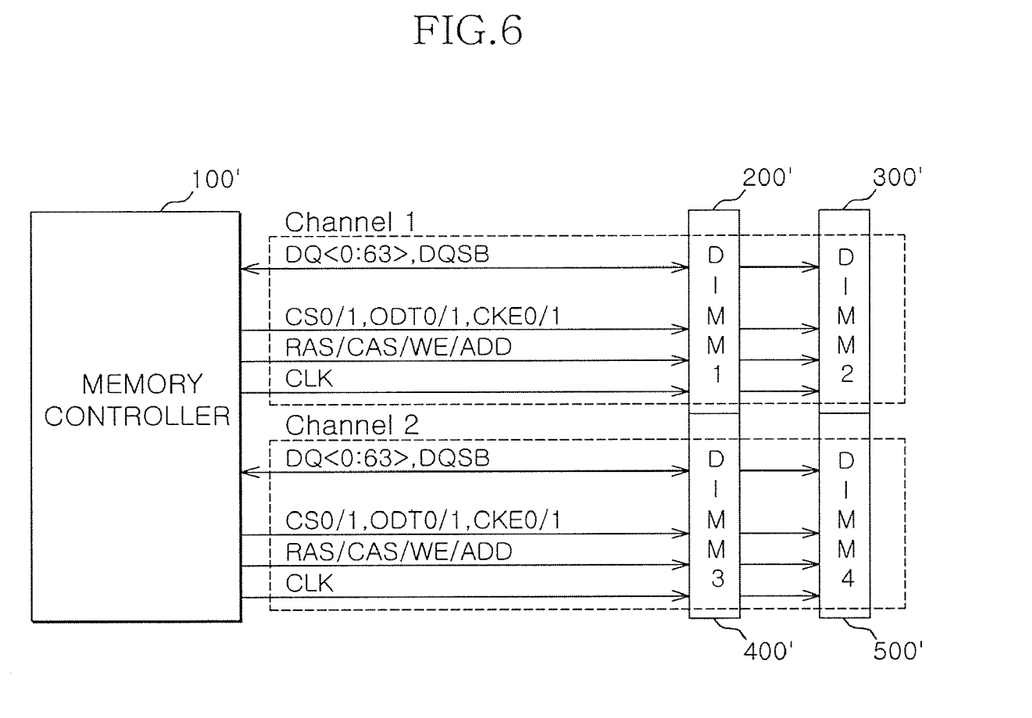
FIG. 6 is a block diagram showing a data input/output system according to another embodiment of the present invention.

FIG. 6 is a block diagram showing a data input/output system according to another embodiment of the present invention.

Referring to FIG. 6, the data input/output system according to the embodiment includes a memory controller 100' and first through fourth memory modules 200', 300', 400', and 500'.

In an embodiment of the present invention, the memory controller 100' has the same configuration as the memory controller 100 of FIG. 2.

Figure 7:
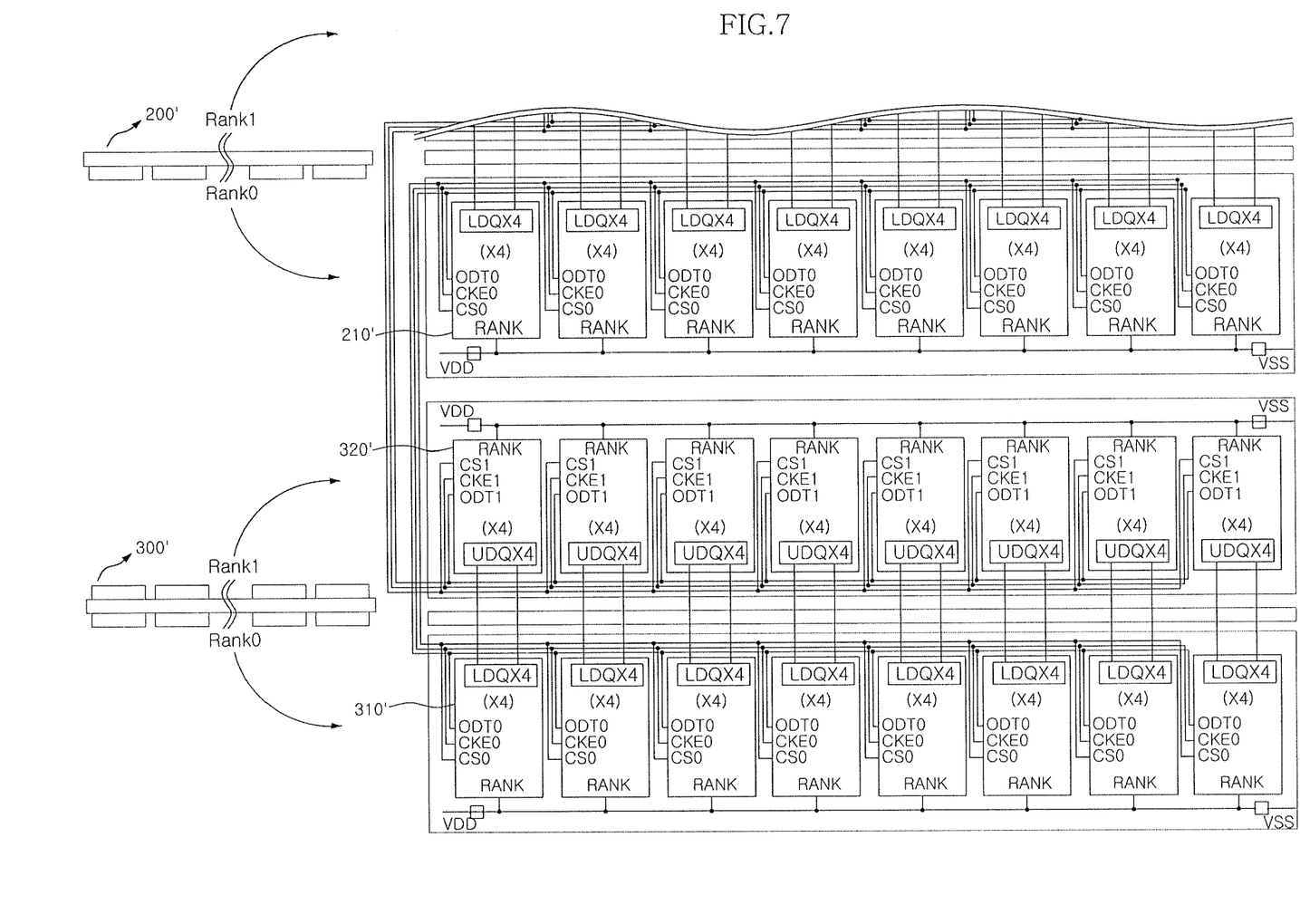
FIG. 7 is a layout diagram showing the memory module of FIG. 6.

FIG. 7 is a layout diagram showing the memory modules of FIG. 6.

In the embodiment of the present invention shown in FIGS. 6 and 7, the first through the fourth memory modules 200', 300', 400, and 500' have a distribution scheme that is different from that of the first through the fourth memory modules 200, 300, 400, and 500 of the embodiment of the present invention shown in FIGS. 2 and 3 with respect to the chip selection signal CS0/1, on die termination signal ODT0/1, and clock enable signal CKE0/1. These differences will be described with reference to both FIG. 3 and FIG. 7.

As shown in FIGS. 2 and 3, each of the memory modules of he first through the fourth memory modules 200, 300, 400, and 500 receives a single chip selection signal, on die termination signal, and clock enable signal that is shared by the ranks of the memory module. For example, in the second memory module 300 shown in FIG. 3, the first and second ranks RANK0 and RANK1 receive the chip selection signal CS1, the on die termination signal ODT1, and the clock enable signal CKE1. Also, in the embodiment of the present invention shown in FIGS. 2-3, the memory modules of a channel (e.g., memory modules 200 and 300) each receives a different chip selection signal (e.g., memory module 200 receives CS0 while memory module 300 receives CS1).

However, in the embodiment of the present invention shown in FIG. 7, the chip selection signal CS0/1, the on die termination signal ODT0/1, and the clock enable signal CKE0/1 may be shared by different memory modules of the same channel.

More specifically, a memory chip 210' installed in the first rank RANK0 of the first memory module 200' and a memory chip 310' installed in the first rank RANK0 of the second memory module 300' may be configured to share the chip selection signal CS0, the on die termination signal ODT0, and the clock enable signal CKE0 as is shown in FIG. 7.

Additionally, a memory chip (not shown) installed in a second rank RANK1 of the first memory module 200' and a memory chip 320' installed in the second rank RANK1 of the second memory module 300' may be configured to share the chip selection signal CS1, the on die termination signal ODT1, and the clock enable signal CKE1.

In an embodiment of the present invention, the memory chips 210', 310', and 320' may have the same configuration as the embodiment described above with reference to FIG. 4, which was described according to the logic table of the above Table 1.

DQ pins may be separated from each other in the memory chip 210' installed in the first rank RANK0 of the first memory module 200' and in the memory chip 310' installed in the first rank RANK0 of the second memory module 300'.

Accordingly, even when the memory chips 210' and 310' are simultaneously activated in response to the activation of the chip selection signal CS0 to thereby output lower order data (GIO_DQ0~7<0:3>) to lower DQ pins (DQ<0:3>) via a lower data output logic LDQX4, overlapping of data does not occur.

Also, DQ pins may be separated from each other in the memory chip (not shown) installed in the second rank RANK1 of the first memory module 200' and in the memory chip 320' installed in the second rank RANK1 of the second memory module 300'. Accordingly, even when the two memory chips are simultaneously activated to thereby output the lower order data (GIO_DQ0~7<0:3>) to upper DQ pins (DQ<4:7>) via an upper data output logic UDQX4, overlapping of data does not occur.

As described above, the memory chip 310' installed in the first rank RANK0 of the second memory module 300! and the memory chip 320' installed in the second rank RANk1 of the second memory module 300' may have the same configuration as memory modules of the embodiment described above with reference to FIG. 4.

Accordingly, even when the memory chips 310' and 320' are simultaneously activated according to the chip selection signal (CS0/1), different DQ pins are used to output data. Accordingly, it is possible to prevent the data from overlapping.

Furthermore, the device and method described herein should not be limited based on the described embodiments. Rather, the devices and methods described herein should only be limited in light of the claims that follow when taken in conjunction with the above description and accompanying drawings.

What is claimed is:

1. A memory module comprising:
a first rank including a first memory chip; and a second rank including a second memory chip, wherein the first and second memory chips are configured to output a plurality of data and include first and second data output pins, and wherein, in a first data output mode:

the first memory chip is configured to output, first data of the plurality of data via the first data output pins, wherein the first data is first order data, and the second memory chip is configured to output second data of the plurality of data via the second data output pins, wherein the second data is also first order data such that the data output from the first and second memory chips are of the same order.

2. The memory module of claim 1, wherein when the first or second memory chip is in a second data output mode:

the respective first or second memory chip is configured to output first order data and second order data via the first data output pins and the second data output pins, wherein the first and second order data is all data output from a corresponding core of the respective first or second memory chip, and wherein the number of data output from any one of the first and second memory chip in the first data output mode is set to be half the number of data that is output in the second data output mode.

3. The memory module of claim 2, wherein the first memory chip comprises:

the core configured to output a plurality of data, wherein the plurality of data output by the core includes the first order data and the second order data;

a lower data output logic configured to output the first order data via the first data output pins, wherein the first order data is lower order data and the first data output pins are lower data output pins, and the lower order data is output via the lower data output pins according to a first activation control signal;

a multiplexing unit configured to select one of the lower order data and the second order data, wherein the second order data is upper order data, and the multiplexing unit selects and outputs one of the lower order data and the upper order data according to a multiplexing control signal;

an upper data output logic configured to output the output of the multiplexing unit via the second data output pins, wherein the second data output pins are upper data output pins and the upper data output logic outputs the output of the multiplexing unit according to a second activation control signal; and a control unit configured to generate the first activation control signal, the second activation control signal, and the multiplexing control signal according to rank information that identifies a rank and an output mode signal that designates the first data output mode and the second data output mode.

4. The memory module of claim 3, wherein the second memory chip has the same configuration as the first memory chip.

5. The memory module of claim 4, wherein the control unit is configured to:

when the rank information identifies the first rank and the output mode signal designates the first data output mode:

activate the first activation control signal and deactivate the second activation control signal and the multiplexing control signal, and when the rank information defines the second rank and the output mode signal defines the first data output mode:

deactivate the first activation control signal and activate the second activation control signal and the multiplexing control signal.

6. The memory module of claim 5, wherein the control unit is configured to:

when the output mode signal designates the second data output mode:

activate the first activation control signal and the second activation control signal and deactivate the multiplexing control signal, regardless of the rank information.

7. A data input/output system comprising:

a first memory module comprising a first rank to be installed with a first memory chip and a second rank to be installed with a second memory chip, wherein the first memory chip and the second memory chip are each configured to output data via a data output pins of a plurality of data output pins that are commonly connected to the first memory chip and the second memory chip, wherein the first and second memory chips are configured to output the respective data via data output pins that do not overlap; and a memory controller configured to commonly supply a chip selection signal to each of the first memory chip and the second memory chip in order to simultaneously activate the first memory chip and the second memory chip such that the first and second memory chips output the respective data via the non-overlapping data output pins.

8. The system of claim 7, wherein, in a first data output mode, the first memory chip and the second memory chip output the respective data via the non-overlapping data output pin of the common data output pins, and in a second data output mode, when only any one of the first memory chip and the second memory chip is installed in the first memory module, the respective first memory chip or second memory chip outputs data via each of the data output pins of the respective first or second memory chip, and wherein the number of data output from any one of the first and second memory chip in the first data output mode is set to be half the number of data that is output in the second data output mode.

9. The system of claim 8, wherein the first memory chip comprises:

a core configured to output a plurality of data including the data output by the first memory chip, wherein the plurality of data output by the core includes lower order data and upper order data;

a lower data output logic configured to output the lower order data via lower data output pins according to a first activation control signal;

a multiplexing unit configured to select and output one of the lower order data and the upper order data according to a multiplexing control signal;

an upper data output logic configured to output the output of the multiplexing unit via upper data output pins according to a second activation control signal; and a control unit configured to generate the first activation control signal, the second activation control signal, and the multiplexing control signal according to rank information that identifies a rank and an output mode signal that designates the first data output mode and the second data output mode.

10. The system of claim 9, wherein the control unit is configured to:

when the rank information identifies the first rank and the output mode signal designates the first data output mode:
    activate the first activation control signal and deactivate the second activation control signal and the multiplexing control signal, and
when the rank information defines the second rank and the output mode signal defines the first data output mode:
    deactivate the first activation control signal and activate the second activation control signal and the multiplexing control signal.

11. The system of claim 10, wherein when the output mode signal designates the second data output mode, the control unit is configured to activate the first activation control signal and the second activation control signal and deactivate the multiplexing control signal, regardless of the rank information.

12. A data input/output system comprising:
    a first memory module comprising a first rank to be installed with a first memory chip and a second rank to be installed with a second memory chip;
    a second memory module comprising a third rank to be installed with a third memory chip; and
    a memory controller configured to commonly supply a chip selection signal to each of the first memory chip and the third memory chip,
    wherein the first memory chip and the third memory chip are simultaneously activated according to the chip selection signal and are configured to output data via data output pins of the respective first and third memory chips.

13. The system of claim 12, wherein,
    in a first data output mode, the first memory chip and the third memory chip each output data via data output pins of the respective first and third memory chips that have the same order,
    in a second data output mode, when only one of the first memory chip and the second memory chip is installed in the first memory module, the respective first memory chip or second memory chip is configured to output data via each of the data output pins of the respective first or second memory chip, and
    wherein the number of data output from a memory chip in the first data output mode is set to be a half of a number of data that is output in the second data output mode.

14. The system of claim 13, wherein the first memory chip comprises:
    a core configured to output a plurality of data including the data output by the first memory chip, wherein the plurality of data output by the core includes lower order data and upper order data;
    a lower data output logic configured to output the lower order data via lower data output pins according to a first activation control signal;
    a multiplexing unit configured to select and output one of the lower order data and the upper order data according to a multiplexing control;
    an upper data output logic configured to output the output of the multiplexing unit via upper data output pins according to a second activation control signal; and
    a control unit configured to generate the first activation control signal, the second activation control signal, and the multiplexing control signal according to rank information that identifies a rank and an output mode signal that designates the first data output mode and the second data output mode.

15. The system of claim 14, wherein the control unit is configured to:
    when the rank information identifies the first rank and the output mode signal designates the first data output mode:
        activate the first activation control signal and deactivate the second activation control signal and the multiplexing control signal, and
    when the rank information defines the second rank and the output mode signal defines the first data output mode:
        deactivate the first activation control signal and activate the second activation control signal and the multiplexing control signal.

16. The system of claim 15, wherein when the output mode signal designates the second data output mode, the control unit is configured to activate the first activation control signal and the second activation control signal and deactivate the multiplexing control signal, regardless of the rank information.

17. A memory chip installed in a rank of a memory module that includes a single rank or a first and second rank, the memory chip comprising:
    a core configured to output a plurality of data, wherein the plurality of data includes first order data and second order data;
    a first data output logic unit configured to output the first order data via first data output pins according to a first activation control signal;
    a multiplexing unit configured to select and output one of the first order data and the second order data according to a multiplexing control signal;
    a second data output logic unit configured to output the output of the multiplexing unit via second data output pins according to a second activation control signal; and
    a control unit configured to generate the first activation control signal, the second activation control signal, and the multiplexing control signal according to rank information that identifies the rank of the memory chip and an output mode signal that designates a data output mode as being one of a first data output mode and a second data output mode.

18. The memory chip of claim 17, wherein the control unit is configured to:
    when the rank information identifies the first rank and the output mode signal designates the first data output mode:
        activate the first activation control signal and deactivate the second activation control signal and the multiplexing control signal such that the memory chip outputs first order data via the first data output pins, and
    when the rank information defines the second rank and the output mode signal defines the first data output mode:
        deactivate the first activation control signal and activate the second activation control signal and the multiplexing control signal such that the memory chip outputs first order data via the second data output pins.

19. The memory chip of claim 17, wherein the control unit is configured to:
    when the output mode signal designates the second data output mode:
        activate the first activation control signal and the second activation control signal and deactivate the multiplexing control signal regardless of the rank information such that memory chip output first and second order data via the first and second pins.

* * * * *